(12) United States Patent
Motohashi et al.

(10) Patent No.: US 7,338,290 B2
(45) Date of Patent: Mar. 4, 2008

(54) PRINTED WIRING BOARD WITH A PLURALITY OF PADS AND A PLURALITY OF CONDUCTIVE LAYERS OFFSET FROM THE PADS

(75) Inventors: Kenji Motohashi, Kanagawa (JP); Takashi Yanagimoto, Kanagawa (JP); Hideji Miyanishi, Kanagawa (JP); Kazumasa Aoki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/585,959

(22) Filed: Oct. 25, 2006

(65) Prior Publication Data

US 2007/0093107 A1 Apr. 26, 2007

(30) Foreign Application Priority Data

Oct. 25, 2005 (JP) ............................. 2005-310311

(51) Int. Cl.
*H01R 12/00* (2006.01)
*H05K 1/00* (2006.01)

(52) U.S. Cl. ......................................... 439/60; 439/55

(58) Field of Classification Search ................. 439/60, 439/55, 61, 68; 174/262, 255; 361/264; 347/148; 257/642, 759
See application file for complete search history.

(56) References Cited

U.S. PATENT DOCUMENTS

| 5,709,576 | A  | * | 1/1998 | Lippmann et al. | ............. 445/3 |
| 5,772,448 | A  | * | 6/1998 | Ekrot et al. | .................... 439/60 |
| 6,191,479 | B1 | * | 2/2001 | Herrell et al. | ............... 257/724 |
| 6,455,941 | B1 | * | 9/2002 | Lee et al. | .................... 257/774 |
| 6,778,198 | B2 | * | 8/2004 | Dances | ........................ 347/148 |
| 7,084,499 | B2 | * | 8/2006 | Shen | ........................... 257/737 |
| 7,265,440 | B2 | * | 9/2007 | Zilber et al. | ................. 257/678 |
| 2002/0074162 | A1 | * | 6/2002 | Su et al. | ..................... 174/262 |
| 2004/0144562 | A1 |   | 7/2004 | Ishikawa | |
| 2006/0022310 | A1 | * | 2/2006 | Egitto et al. | ................. 257/642 |
| 2007/0012475 | A1 | * | 1/2007 | Kawaguchi et al. | ........ 174/255 |

FOREIGN PATENT DOCUMENTS

| JP | 06-168297 | 6/1994 |
| JP | 09-097957 | 4/1997 |
| JP | 2002-009511 | 1/2002 |
| JP | 2003-282768 | 10/2003 |
| JP | 2004-228478 | 8/2004 |

* cited by examiner

*Primary Examiner*—Chandrika Prasad
(74) *Attorney, Agent, or Firm*—Harness, Dickey & Pierce, P.L.C.

(57) ABSTRACT

A design rule for a printed wiring board is provided. A conductive layer and a pad are separate from each other in a distance defined by the design rule, which sufficiently prevents the capacitance coupling between the conductive layer and the pad.

20 Claims, 9 Drawing Sheets

PRINTED WIRING BOARD WITH A PLURALITY OF PADS AND A PLURALITY OF CONDUCTIVE LAYERS OFFSET FROM THE PADS

CROSS-REFERENCE TO RELATED APPLICATIONS

This patent application is based on and claims priority under 35 U.S.C. §119 to Japanese patent application No. 2005-310311 filed on Oct. 25, 2005, in the Japanese Patent Office, the entire contents of which are hereby incorporated by reference.

FIELD

Example embodiments of the present invention relate generally to a printed wiring board with controlled impedance, and an electronic device or an apparatus incorporating the printed wiring board.

DESCRIPTION OF THE RELATED ART

When designing a transmission line for a printed wiring board, the impedance at various points of the transmission line needs to be matched to minimize reflections of the signal. For this reason, the impedance of the transmission line at various points is usually set to a standard value determined by the standard organization or to a value defined by the manufacture's design rule.

For example, as illustrated in FIG. 1, a transmission line 305 may be formed on the top surfaces of a printed wiring board 301 and a printed wiring board 302 to transmit a signal between a device 303 formed on the printed wiring board 301 and a device 304 formed on the printed wiring board 302 through a connector 306. The components of the transmission line 305, such as wiring patterns, need to be designed so as to have the impedance value defined by the standard organization or the design rule. For example, the transmission line 305 may be formed as a differential microstrip line as shown in FIG. 2. The transmission line 305 includes two wiring patterns 311, a dielectric layer 313, and a conductive layer 312. The parameters of the transmission line 305, including, for example, the width W of the wiring pattern 311, the gap G between the wiring patterns 311, or the thickness D of the dielectric layer 313, may be determined based on the standard impedance value. The technique for determining the parameters is described in, for example, the U.S. Patent Application Publication No. 2004/0144562, published on Jul. 29, 2004.

SUMMARY

However, the impedance of the transmission line 305 fluctuates at several points even when the parameters of the transmission line 305 are designed based on the standard impedance value as described above referring to FIG. 2. For example, referring to FIG. 1, the inventors of the present invention have observed that the impedance value detected around a portion where the connector 306 and the board 301 are connected tends to be lower than the standard impedance value. The reduced impedance may be caused by the capacitor coupling between an edge of a pad and an edge of a conductive layer provided below the pad.

In view of the above, example embodiments of the present invention provide a design rule, which may be used when designing a printed wiring board. In one example, when designing a conductive layer, which is to be provided below a pad formed on a top surface of the printed wiring board, an edge of the conductive layer is spaced away from an edge of the pad in a board length direction. In this manner, the capacitance coupling between the pad and the conductive layer may be sufficiently suppressed. The design rule may additionally define a distance between the edge of the conductive layer and the edge of the pad provide above the conductive layer to be equal to or greater than 0.2 mm. Based on the design rule, the printed wiring board with controlled impedance may be easily designed.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EXAMPLE EMBODIMENTS

Figure 3:
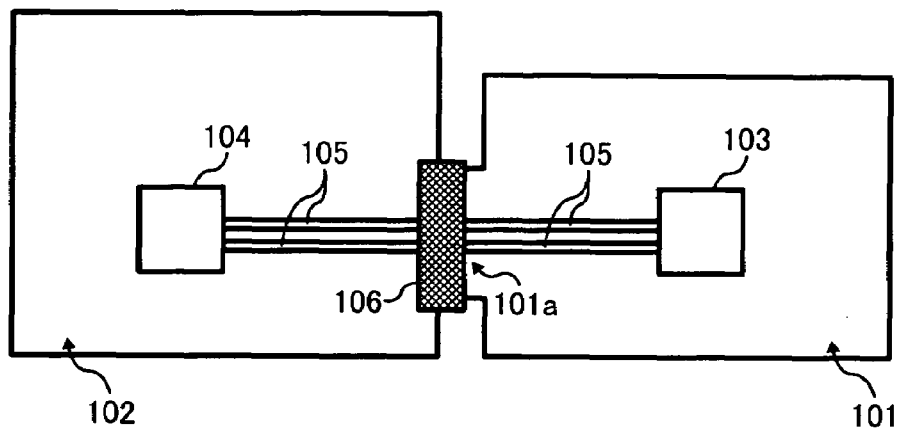
FIG. 3 is a schematic top view illustrating an electronic device having two printed wiring boards connected with each other through a connector, according to an example embodiment of the present invention.

In describing the example embodiments illustrated in the drawings, specific terminology is employed for clarity. However, the disclosure of this patent specification is not intended to be limited to the specific terminology selected and it is to be understood that each specific element includes all technical equivalents that operate in a similar manner. Referring now to the drawings, wherein like reference numerals designate identical or corresponding parts throughout the several views, FIG. 3 illustrates a printed wiring board 101 according to an example embodiment of the present invention.

Figure 4:
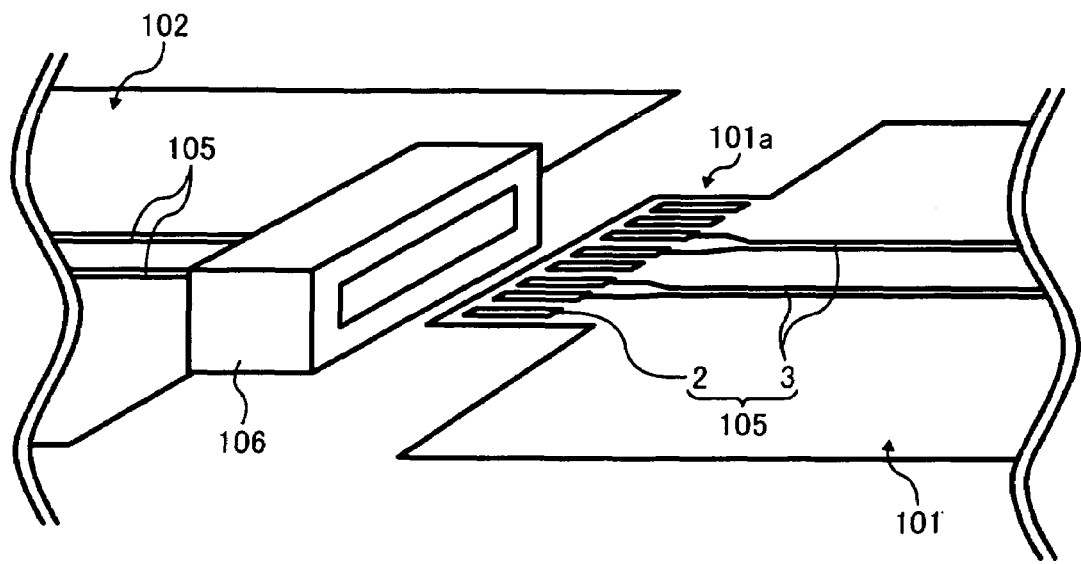
FIG. 4 is a perspective view illustrating the interconnections between the printed wiring boards shown in FIG. 3 according to an example embodiment of the present invention.

The printed wiring board ("the board") 101 has a connector section 101a, which is electrically connected to an edge connector 106 provided with a printed wiring board ("the board") 102. For example, as illustrated in FIG. 4, the connector section 101a of the board 101 is inserted into the edge connector 106. The boards 101 and 102 may be incorporated into one electronic device or two separate electronic devices. In one example, the board 101 may be implemented by a Peripheral Component Interconnect Express (PCI-Express) card, which may be inserted into a PCI slot of a motherboard. In such case, the board 102 and the edge connector 106 respectively correspond to the motherboard and the PCI slot. Further, the board 101 or 102 may have a dimension different from the dimension illustrated in FIG. 3.

The boards 101 and 102 respectively have devices 103 and 104 mounted thereon. The device 103 mounted on the top surface of the board 101 communicates with the device 104 mounted on the top surface of the board 102 via a transmission line 105. In this example, as illustrated in FIG. 4, a differential signal line is preferably used as the transmission line 105. With the recent increase demand for high-speed transmission, the transmission line 105 suitable for the high-speed transmission of more than 1.0 Gbps is desired. Further, the transmission line 105 includes a plurality of pads 2 formed on the top surface and the bottom surface of the board 101, and a wiring pattern 3 extending from at least one of the plurality of pads 2.

Figure 5:
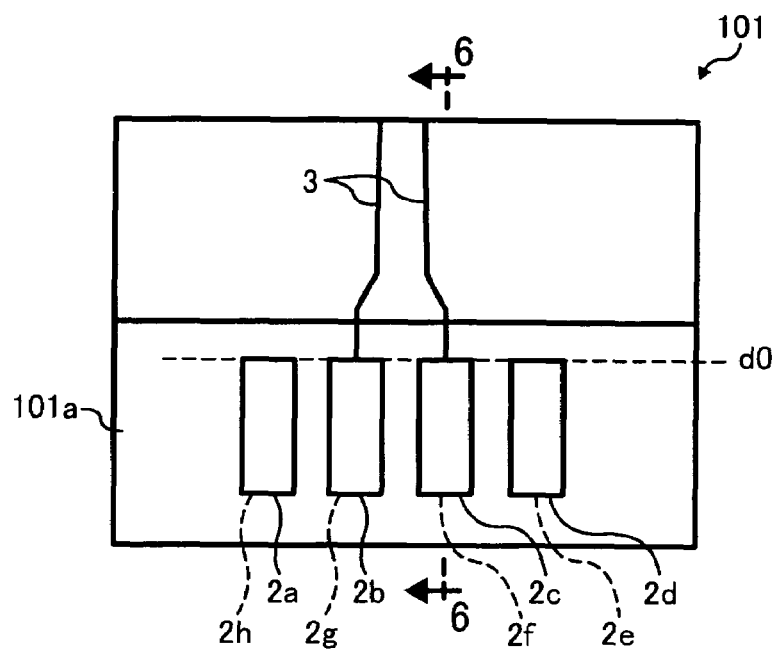
FIG. 5 is a schematic top view illustrating an example structure of a connector section of the printed wiring board shown in FIG. 3 or 4.
Figure 6:
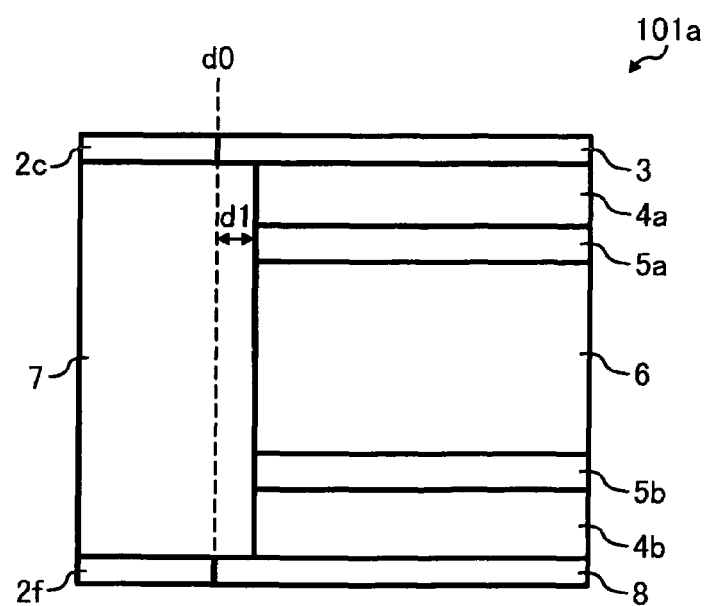
FIG. 6 is a schematic cross-sectional view illustrating the connector section shown in FIG. 5.

FIG. 5 illustrates an enlarged section of the board 101 including the connector section 101a, viewed from the above. FIG. 6 illustrates a cross-section of the connector section 101a shown in FIG. 5.

Referring to FIG. 5, the plurality of pads 2, which is formed on the top surface of the board 101, electrically connects the board 101 with the edge connector 106 (FIG. 4). In this example, the plurality of pads 2 is arranged in parallel from each other in a board width direction such that the edges of the pads 2 facing the device 103 are aligned along a reference line d0. As shown in FIG. 5, the plurality of pads 2 is also arranged on the bottom surface of the board 101 in a corresponding manner with the plurality of pads 2 formed on the top surface. FIG. 5 illustrates four pads 2a, 2b, 2c, and 2d formed on the top surface, and four pads 2e, 2f, 2g, and 2h formed on the bottom surface below the four pads 2a, 2b, 2c, and 2d. However, the number of pads is not limited to this example.

Referring to FIGS. 5 and 6, the wiring pattern 3 is extended from at least one of the plurality of pads 2 formed on the top surface. In this example, the wiring pattern 3 is extended from the pad 2b and pad 2c so as to transmit a differential signal.

Referring to FIG. 6, the connector section 101a has a microstrip structure. Between the top surface on which the pad 2c and the wiring pattern 3 are formed and the bottom surface on which the pad 2f and a bottom layer 8 are formed, four layers including a first dielectric layer 4a, a first interlaying conductive layer 5a, a second interlaying conductive layer 5b, and a second dielectric layer 4b are provided. The first dielectric layer 4a and the first interlaying conductive layer 5a are separated from the second dielectric layer 4b and the second interlaying conductive layer 5b by a core material 6. Further, in this example, the bottom layer 8, the first interlaying conductive layer 5a, and the second interlaying conductive layer 5b are each connected to the ground.

The interlaying conductive layers 5a and 5b (collectively referred to as the "interlaying conductive layer 5"), are spaced from each other in the board thickness direction. Further, the interlaying conductive layer 5 is provided in parallel with the top surface of the board 101 or the bottom surface of the board 101. In order to sufficiently suppress the negative influence of the capacitor coupling between the pad 2 and the interlaying conductive layer 5, the edge of the interlaying conductive layer 5 is spaced away from the edge of the pad 2 in a board length direction.

In one example, the edge of the interlaying conductive layer 5 may be spaced away from the edge of the pad that is provided in a vicinity of the interlaying conductive layer 5. In this example, the edge of the first interlaying conductive layer 5a is provided away from the edge of the pad 2c that is provided in the vicinity of the first interlaying conductive layer 5a. Similarly, the edge of the second interlaying conductive layer 5b is spaced away from the edge of the pad 2f that is provided in the vicinity of the first interlaying conductive layer 5b.

In another example, the edge of the interlaying conductive layer 5 may be spaced away from the edge of the pad that is connected to the wiring pattern 3. In this example, the edge of the first interlaying conductive layer 5a is spaced away from the edge of the pad 2c that is connected to the wiring pattern 3. In another example, the edge of the second interlaying conductive layer 5b is spaced away from the edge of the pad 2c that is connected to the wiring pattern 3. Since the pad 2f is not connected to the wiring pattern 3 but connected to the ground, a distance between the pad 2f and the interlaying conductive layer 5 may not be considered.

In another example, the interlaying conductive layer 5 may be provided such that the edge of the interlaying conductive layer 5 is placed at a position, which is determined relatively to a point along the reference line d0 extended vertically from the edge of the pad 2 in the board thickness direction, as illustrated in FIG. 6. In this example, the position is previously determined such that a distance between the edge of the interlaying conductive layer 5 and the point along the reference line d0 has a distance d1. The value of the distance d1 is determined based on the observed relationship between the impedance value of the transmission line 105 and the value of the distance d1.

Figure 7:
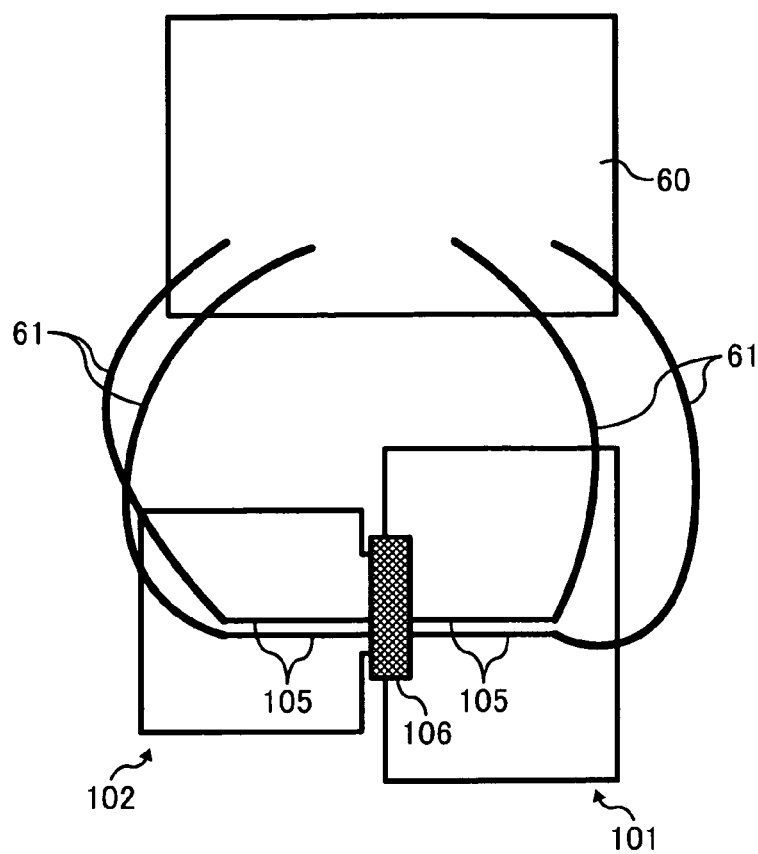
FIG. 7 is an illustration for explaining an operation of obtaining an impedance value from a printed wiring board according to an example embodiment of the present invention.

For example, the impedance value may be obtained using an impedance analyzer 60 shown in FIG. 7. The impedance analyzer 60 includes any kind of device capable of obtaining the impedance value from a board connected to the analyzer 60, such as a vector network analyzer. The cables 61 of the impedance analyzer 60 are connected respectively to the ends of the wiring patterns 3 of the transmission line 105. The impedance value may be obtained, for example, by applying the inverse Fast Fourier Transform to the scattering parameter (S parameter).

Figure 8:
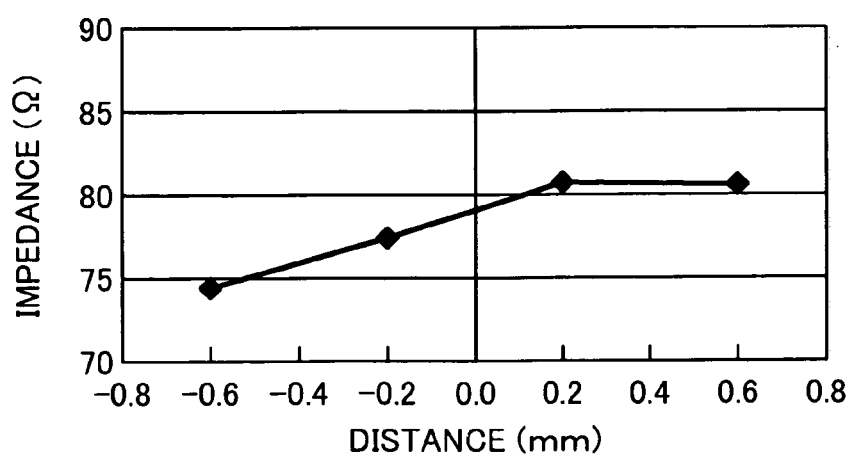
FIG. 8 is a graph illustrating the observed relationship between an impedance value obtained from the connector section shown in FIG. 6 and a distance between a pad and a conductive layer of the connector section shown in FIG. 6.

As illustrated in FIG. 8, the impedance value may be obtained for each one of the four cases including: a first case at which the distance d1 is set to −0.6 mm from the point in the reference line d0; a second case at which the distance d1 is set to −0.2 mm from the point in the reference line d0; a third case at which the distance d1 is set to +0.2 mm from the point in the reference line d0; and a fourth case at which the distance d1 is set to +0.6 mm from the point in the reference line d0.

The negative value of the distance d1 corresponds to the case where the interlaying conductive layer 5 is placed near the pad 2 at a position across the reference line d0. This increases the capacitor coupling between the pad 2 and the interlaying conductive layer 5, causing the impedance value to decrease as shown in FIG. 8. Referring to FIG. 8, the obtained impedance values are 74.4 ohm for the first case, 77.4 ohm for the second case, 80.7 ohm for the third case, and 80.6 ohm for the fourth case. Based on the observed relationship between the impedance and the distance d1 shown in FIG. 8, the value of the distance d1 may be preferably set to 0.2 mm or greater. The obtained value of the distance d1 may be included in a design rule. In this manner, impedance matching may be performed more easily.

Figure 9:
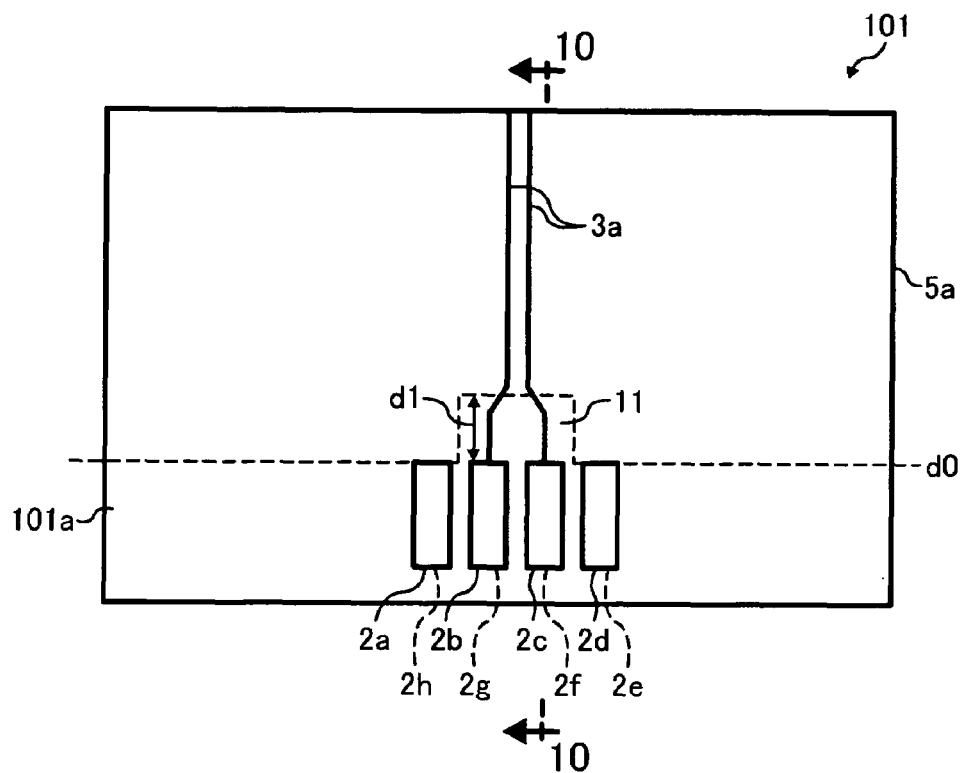
FIG. 9 is a schematic top view illustrating an example structure of a connector section of the printed wiring board shown in FIG. 3 or 4.
Figure 10:
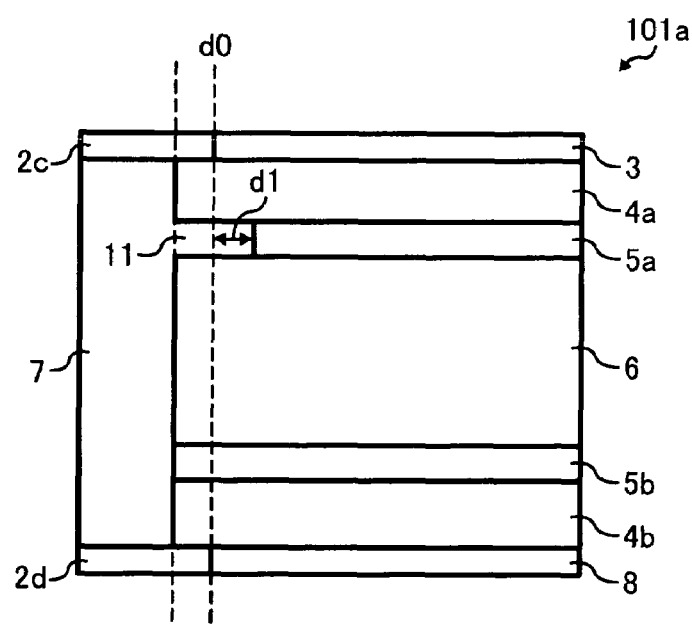
FIG. 10 is a schematic cross-sectional view illustrating the connector section shown in FIG. 9.

Alternatively, in order to suppress the capacitance coupling between the pad 2 and the interlaying conductive layer 5, the interlaying conductive layer 5 may be provided with a cut section 11 as illustrated in FIG. 9 or 10.

Figure 1:
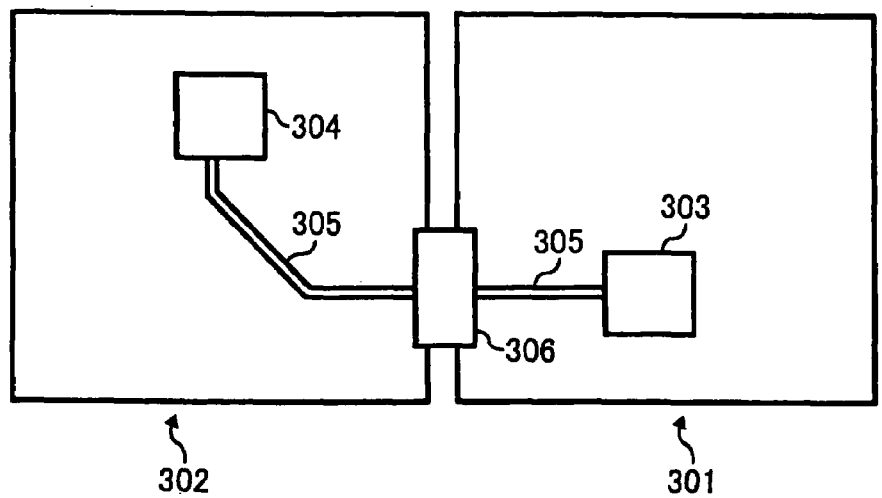
FIG. 1 is a schematic top view illustrating an electronic device having two background printed wiring boards connected with each other through a connector.
Figure 2:
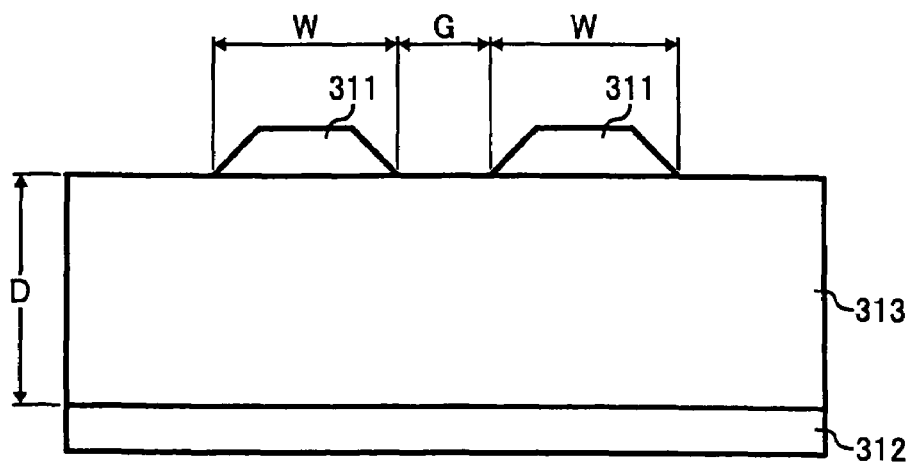
FIG. 2 is a schematic cross-sectional view illustrating an example structure of a transmission line formed on the background printed wiring boards shown in FIG. 1.

For example, as illustrated in FIG. 10, the first conductive layer 5a may be provided with the cut section 11 such that the edge of the first conductive layer 5a is spaced away from the edge of the pad 2c. In this example, the edge of the first conductive layer 5a at the cut section 11 is spaced away from the edge of the pad 2c in a distance d1. As obtained above referring to FIG. 1, the distance d1 may be set to 0.2 mm or greater. Additionally, the second conductive layer 5b may be provided with the cut section 11.

Figure 11:
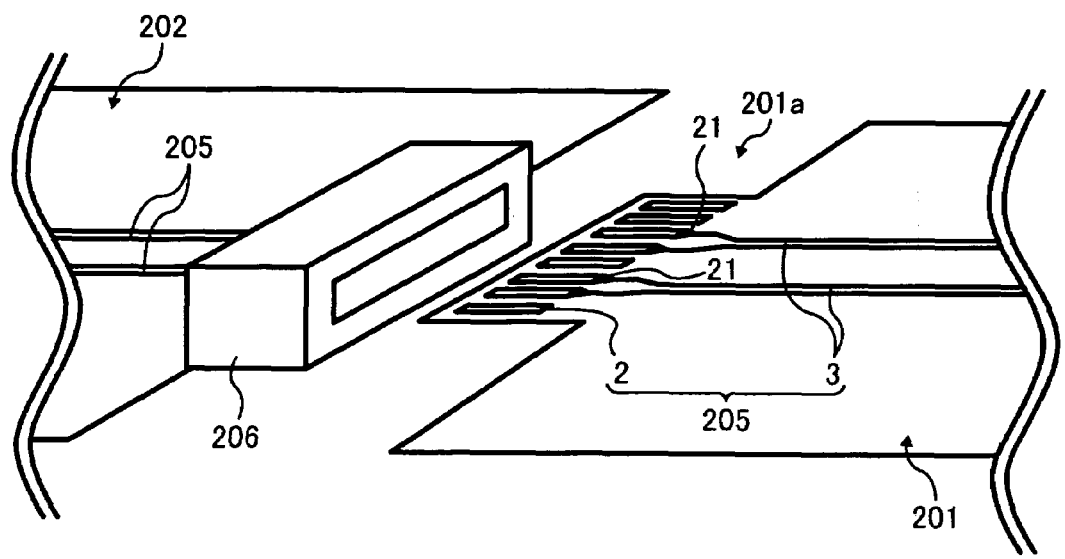
FIG. 11 is a perspective view illustrating the interconnections between two printed wiring boards connected with each other through a connector, according to an example embodiment of the present invention.
Figure 12:
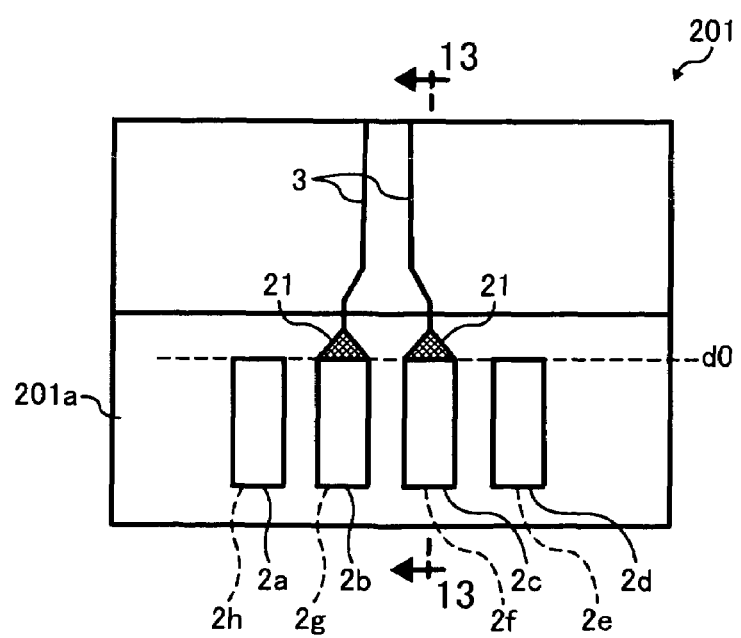
FIG. 12 is a schematic top view illustrating an example structure of a connector section of the printed wiring board shown in FIG. 11.
Figure 13:
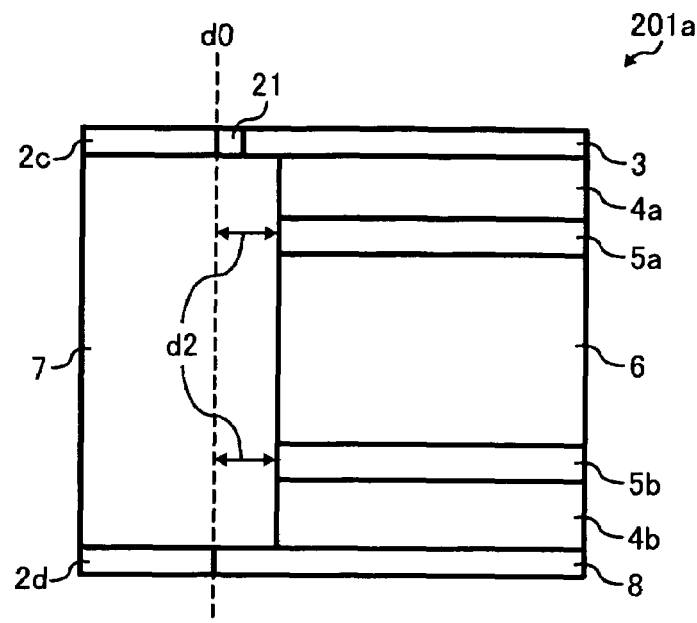
FIG. 13 is a schematic cross-sectional view illustrating the connector section shown in FIG. 12.

Referring now to FIGS. 11, 12, and 13, a printed wiring board 201 is explained according to another example embodiment of the present invention. FIG. 11 illustrates a perspective view of the board 201 including a connector section 201a. FIG. 12 illustrates an enlarged section of the connector section 201a, viewed from the above. FIG. 13 illustrates a cross-section of the connector section 201a shown in FIG. 12. As described above referring to FIG. 3, the connector section 201a of the board 201 is inserted into a connector 206 of a printed wiring board 202 to transmit a signal through a transmission line 205.

Figure 14:
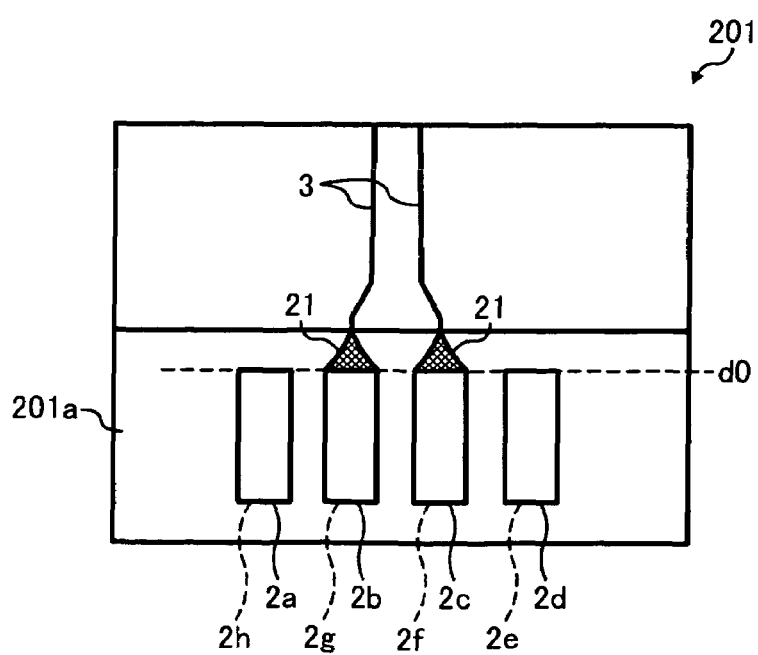
FIG. 14 is a schematic top view illustrating an example structure of a connector section of the printed wiring board shown in FIG. 11.

Referring to any one of FIGS. 11, 12 and 13, the board 201 is substantially similar in structure to the board 101 shown in any one of FIGS. 3, 4, and 5. The differences include the addition of a conductor 21, which is provided on the top surface of the board 201 between the pad 2 and the wiring pattern 3. As shown in FIG. 12, the conductor 21 may have a first side surface being in contact with the pad 2, and a second side surface being in contact with the wiring pattern 3. In this example, the width in the board width direction of the conductor 21 is decreased gradually from the first side surface to the second side surface to cause two other surfaces of the conductor 21 to form an angular shape pointed toward the wiring pattern 3. With the angular shaped surfaces, the difference in impedance value that may be generated between the pad 2 and the wiring pattern 3 may be suppressed. Further, the conductor 21 may protect the board 201 from being damaged during the manufacturing process of the board 201. In one example, the top surface of the conductor 21 may have a triangular shape as shown in FIG. 12. In another example, the top surface of the conductor 21 may have a tapered shape as shown in FIG. 14.

Further, in this example, the interlaying conductive layer 5 may be provided such that the edge of the interlaying conductive layer 5 is placed at a position determined relatively to a point along the reference line d0 while considering the length of the conductor 21. The distance d2 between the position of the edge of the interlaying conductive layer 5 and the edge of the pad 2 may be estimated from the value of the distance d1 and the length of the conductor 21. If the length of the conductor 21 in the board length direction is set to be about 0.35 mm, the value of the distance d2 should be at least the sum of the distance d1 and the length of the conductor 21, which is 0.55 mm (0.2 mm+0.35 mm).

Figure 15:
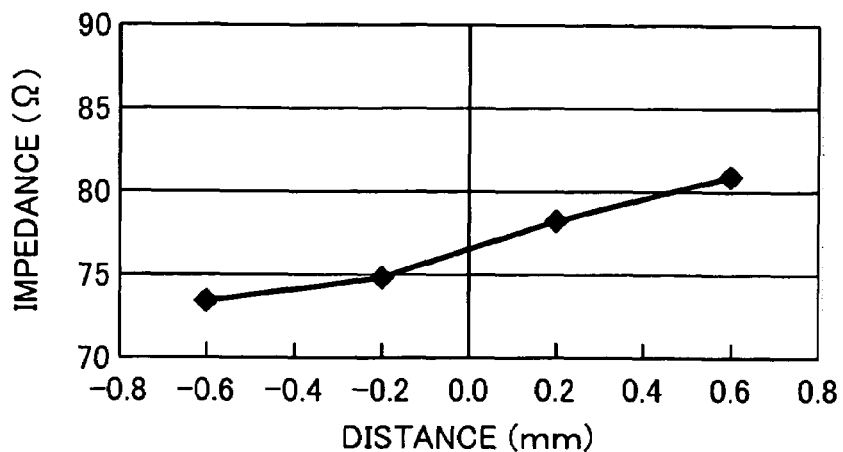
FIG. 15 is a graph illustrating the observed relationship between an impedance value obtained from the connector section shown in FIG. 13 and a distance between a pad and a conductive layer of the connector section shown in FIG. 13.

Alternatively, the value of the distance d2 may be determined based on the observed relationship between the impedance value and the value of the distance d2 in a substantially similar manner as described referring to FIG. 7. As illustrated in FIG. 15, the impedance value may be obtained for each one of the four cases including: a first case at which the distance d2 is set to −0.6 mm from the point in the reference line d0; a second case at which the distance d2 is set to −0.2 mm from the point in the reference line d0; a third case at which the distance d2 is set to +0.2 mm from the point in the reference line d0; and a fourth case at which the distance d2 is set to +0.6 mm from the point in the reference line d0.

The obtained impedance values are 73.4 ohm for the first case, 74.8 ohm for the second case, 78.2 ohm for the third case, and 80.9 ohm for the fourth case. Based on the observed relationship between the impedance and the distance d2 shown in FIG. 15, the value of the distance d2 may be preferably set to 0.6 mm or greater.

Figure 16:
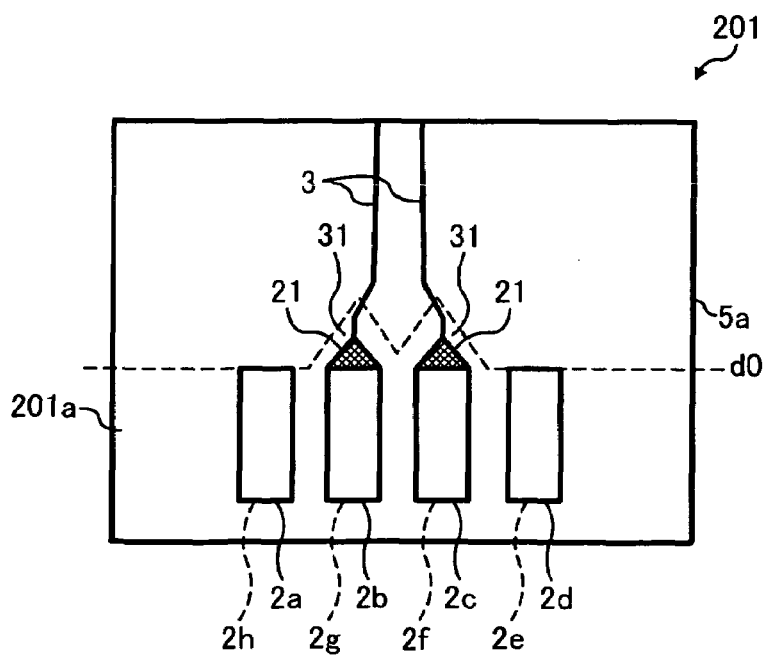
FIG. 16 is a schematic top view illustrating an example structure of a connector section of the printed wiring board shown in FIG. 11.

Alternatively, in order to suppress the capacitance coupling between the pad 2 and the interlaying conductive layer 5, the first interlaying conductive layer 5a may be provided with a cut section 31 as illustrated in FIG. 16, in a substantially similar manner as described above referring to FIG. 9 or 10. Additionally, the second interlaying conductive layer 5b may be provided with the cut section. However, the cut section 31 causes the first interlaying conductive layer 5a to have a valley surface that corresponds to the angular surface of the conductor 21. Further, the cut section 31 has a maximum length in the board length direction such that the valley surface of the interlaying conductive layer 5a at the cut section 31 is spaced away from the angular surface of the conductor 21.

Figure 17:
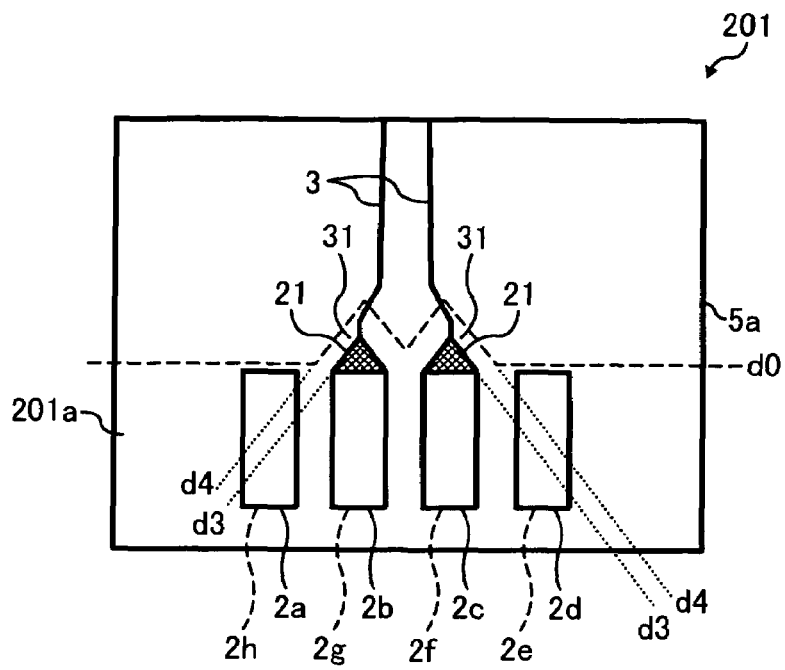
FIG. 17 is an illustration for explaining a distance between an edge of a conductive layer and an edge of a conductor shown in FIG. 16.

For example, as illustrated in FIG. 17, the cut section 31 may be formed such that the edge of the first conductive layer 5a at the cut section 31 is placed at a position determined relatively to the edge of the conductor 21, or any point along a reference line d3 extended from the edge of the conductor 21. The distance d4 between the position of the edge of the first conductive layer 5a at the cut section 31 and the position of the edge of the conductor 21 may be determined based on the observed relationship between the impedance value of the transmission line 205 and the value of the distance d4 in a substantially similar manner as described above referring to FIG. 7.

Figure 18:
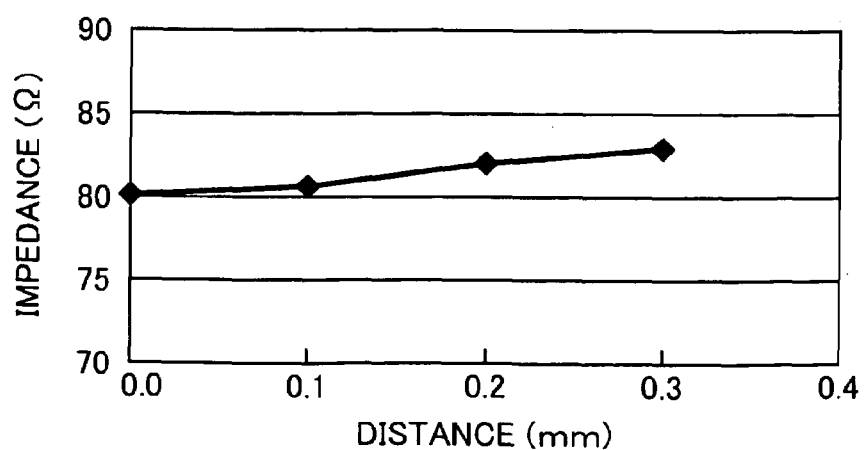
FIG. 18 is a graph showing the observed relationship between an impedance value obtained from the connector section shown in FIG. 17 and the distance between the edge of the conductive layer and the edge of the conductor shown in FIG. 17.

As illustrated in FIG. 18, the impedance value may be obtained for each one of the four cases including: a first case at which the distance d4 is set to 0 mm from the point in the reference line d3; a second case at which the distance d4 is set to 0.1 mm from the point in the reference line d3; a third case at which the distance d4 is set to 0.2 mm from the point in the reference line d3; and a fourth case at which the distance d4 is set to 0.3 mm from the point in the reference line d3.

Referring to FIG. 18, the obtained impedance values are 80.1 ohm for the first case, 80.6 ohm for the second case, 82 ohm for the third case, and 82.9 ohm for the fourth case. Based on the observed relationship between the impedance and the distance shown in FIG. 18, the value of the distance d4 may be preferably set to 0.3 mm or greater. The value of the distance d4 may be included in a design rule. In this manner, impedance matching may be performed more easily.

Numerous additional modifications and variations are possible in light of the above teachings. It is therefore to be understood that within the scope of the appended claims, the disclosure of this patent specification may be practiced in ways other than those specifically described herein.

For example, elements and/or features of different illustrative embodiments may be combined with each other and/or substituted for each other within the scope of this disclosure and appended claims.

Further, any one of the electronic devices or the printed wiring boards described above may be incorporated into any kind of apparatus, for example, an information processing apparatus such as a computer, an image forming apparatus such as a facsimile, copier, or printer.

The invention claimed is:

1. A printed wiring board configured to be connected with a connector, the board comprising:
   a plurality of pads formed on a surface of the board and configured to electrically connect the board to the connector, the plurality of pads comprising a first pad;
   a wiring pattern formed on the surface of the board and configured to transmit a signal; and
   a plurality of conductive layers provided in parallel to the surface of the board and configured to be separated from each other in a board thickness direction, the plurality of conductive layers comprising a first conductive layer having an edge being spaced away from an edge of the first pad in a board length direction.

2. The board of claim 1, wherein the first pad is provided in a vicinity of the first conductive layer.

3. The board of claim 1, wherein the first pad is connected to the wiring pattern.

4. The board of claim 1, wherein the edge of the first conductive layer is placed at a position determined relatively to a point along a reference line extended vertically in the board thickness direction from the edge of the first pad.

5. The board of claim 4, wherein a distance between the position of the edge of the first conducive layer and the point along the reference line is equal to or greater than 0.2 mm.

6. The board of claim 1, wherein the first conductive layer comprises a cut section having a length in a board length direction, wherein the length of the cut section is determined such that the edge of the first conductive layer is spaced away from the edge of the first pad.

7. The board of claim 3, further comprising:
   a conductor formed on the surface of the board between the first pad and the wiring pattern.

8. The board of claim 7, wherein the conductor comprises two side surfaces that together form an angular shape pointed toward the wiring pattern.

9. The board of claim 8, wherein the conductor comprises a top surface having a triangular shape.

10. The board of claim 8, wherein the conductor comprises a top surface having a tapered shape.

11. The board of claim 4, further comprising:
    a conductor configured to have a length in a board length direction and formed on the surface of the board between the first pad and the writing pattern, wherein a distance between the position of the edge of the first conductive layer and the point along the reference line is equal to or greater than the sum of 0.2 mm and the length of the conductor.

12. The board of claim 8, wherein the first conductive layer comprises a cut section causing the first conductive layer to have a valley surface corresponding to the angular surface of the conductive layer, the cut section having a maximum length in a board length direction such that the valley surface of the first conductive layer at the cut section is spaced away from the angular surface of the conductor.

13. The board of claim 7, wherein a distance between the edge of the first conductive layer at the cut section and the edge of the conductor is equal to or greater than 0.3 mm.

14. The board of claim 3, wherein the plurality of pads comprises a second pad connected to the wiring pattern, with the signal transmitted by the wiring pattern being a differential signal.

15. An electronic device, comprising:
    a first printed wiring board and a second printed wiring board connected through a connector, the first printed wiring board comprising:
       a plurality of pads formed on a surface of the board and configured to electrically connect the board to the connector, the plurality of pads comprising a first pad;
       a wiring pattern formed on the surface of the board and configured to transmit a signal; and
       a plurality of conductive layers provided away from and in parallel to the surface of the board and separated from each other in a board thickness direction, the plurality of conductive layers comprising a first conductive layer having an edge being spaced away from an edge of the first pad in a board length direction.

16. The device of claim 15, wherein the first pad is provided in a vicinity of the first conductive layer.

17. The device of claim 15, wherein the first pad is connected to the wiring pattern.

18. The device of claim 15, wherein a distance between the edge of the first conductive layer and the edge of the first pad is designed to be equal to or greater than 0.2 mm.

19. The device of claim 15, wherein the first conductive layer comprises a cut section having a length in a board length direction, wherein the length of the cut section is determined such that the edge of the first conductive layer is spaced away from the edge of the first pad.

20. The device of claim 17, wherein the first printed wiring board further comprises:
    a conductor formed on the surface of the board between the first pad and the wiring pattern.

* * * * *